United States Patent

Swisher et al.

[11] Patent Number: 5,863,608
[45] Date of Patent: Jan. 26, 1999

[54] METHOD OF PREPARING ADHERENT/COHERENT AMORPHOUS FLUOROCARBON COATINGS

[75] Inventors: Richard Swisher, Northfield; James Andrew Phipps, Burnsville; Douglas Ray Pelleymounter; James Leroy Grieser, both of Northfield, all of Minn.

[73] Assignee: Sheldahl, Inc., Northfield, Minn.

[21] Appl. No.: 991,658

[22] Filed: Dec. 16, 1992

Related U.S. Application Data

[63] Continuation of Ser. No. 679,255, Apr. 2, 1991, abandoned, which is a continuation-in-part of Ser. No. 506,720, which is a continuation of PCT/US90/06696, Nov. 15, 1990, abandoned.

[51] Int. Cl.$^6$ .............................. C23C 14/12; B05D 1/00
[52] U.S. Cl. .................................. 427/255.6; 427/412.1; 427/412.4; 427/421; 427/429; 427/430.1
[58] Field of Search .......................... 427/255.6, 255.7, 427/412.4, 412.1, 429, 421, 430.1; 526/247, 246

[56] References Cited

U.S. PATENT DOCUMENTS

| | | | |
|---|---|---|---|
| 2,893,900 | 7/1959 | Machlin | 427/104 |
| 3,953,566 | 4/1976 | Gore | 264/288 |
| 3,962,153 | 6/1976 | Gore | 521/79 |
| 4,016,125 | 4/1977 | Vassiliou et al. | 427/412.4 |
| 4,096,227 | 6/1978 | Gore | 264/210 R |
| 4,187,390 | 2/1980 | Gore | 285/53 |
| 4,543,275 | 9/1985 | Akashi et al. | 427/250 |
| 4,563,336 | 1/1986 | McKnight | 174/102 R |
| 4,718,907 | 1/1988 | Karwoski et al. | 623/12 |
| 4,791,012 | 12/1988 | D'Agostino et al. | 428/35.3 |
| 4,824,147 | 4/1989 | De Gruijter | 422/240 |
| 4,863,762 | 9/1989 | Aramaki et al. | 427/255.6 |
| 4,883,716 | 11/1989 | Ettenberger et al. | 428/421 |
| 5,008,129 | 4/1991 | Boling et al. | 427/160 |

*Primary Examiner*—Roy V. King
*Attorney, Agent, or Firm*—Haugen and Nikolai, P.A.

[57] ABSTRACT

A method for preparing a castable amorphous fluorocarbon coating upon the surface of a substrate which includes the steps of initially depositing a film of a fluorocarbon having a thickness between about 1500 Å and 50,000 Å, and thereafter applying a second coating as a coverlay upon the initial film. Both the initial film and the castable coating consist of an amorphous fluorinated (ethylenic-cyclo oxyaliphatic substituted ethylenic) copolymer having the structural repeating unit:

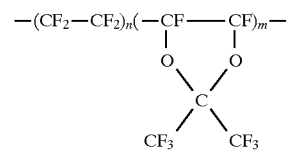

wherein "m" and "n" represent integers providing a molecular weight of between about 230,000 and 500,000, with the relative values of "m" and "n" providing a copolymer with a glass transition temperature ranging from between about 160° C. and 240° C.

3 Claims, 1 Drawing Sheet

---

EVAPORATIVELY DEPOSIT FLUORINATED (ETHYLENIC-CYCLO OXYALIPHATIC SUBSTITUTED ETHYLENIC) COPOLYMER FILM WITH M.W. BETWEEN 230,000 AND 500,000 ONTO SUBSTRATE SURFACE UNTIL FILM THICKNESS EXCEEDS 1500 Å°

↓

APPLY CASTABLE COATING OF SAME FLUORINATED (ETHYLENIC-CYCLO OXYALIPHATIC SUBSTITUTED ETHYLENIC) COPOLYMER MATERIAL ONTO FILM SURFACE TO OBTAIN INTEGRAL COATING

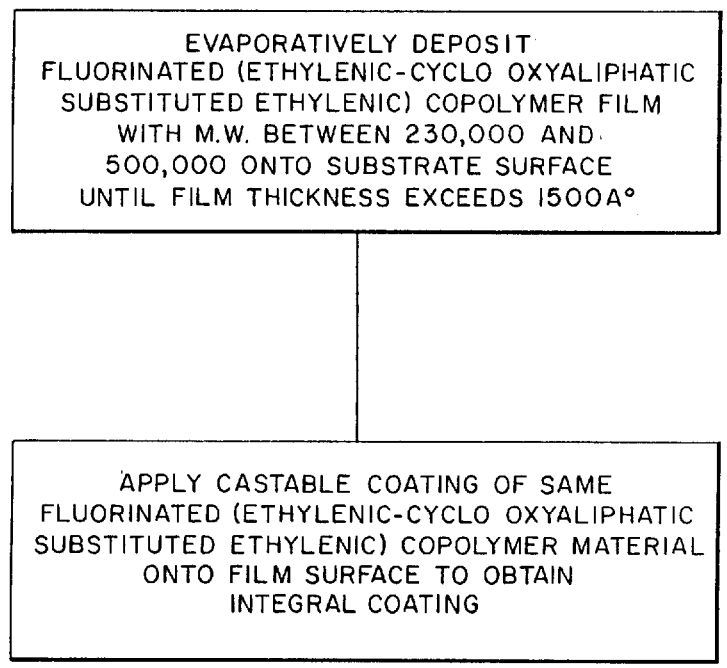

METHOD OF PREPARING ADHERENT/COHERENT AMORPHOUS FLUOROCARBON COATINGS

CROSS-REFERENCE TO RELATED APPLICATION

This is a Continuation of application Ser. No. 07/679,255, filed on Apr. 2, 1991, now abandoned, which was a continuation-in-part of application Ser. No. 07/506,720 filed Apr. 10, 1990 entitled "METHOD OF PREPARING AMORPHOUS FLUOROCARBON COATINGS", now abandoned, which was a continuation of PCT/US90/06696 filed Nov. 15, 1990.

BACKGROUND OF THE INVENTION

The present invention relates generally to an improved system for preparing highly adherent/coherent coatings of high molecular weight amorphous fluorinated polymers such as fluorinated ethylenic-cyclo oxyaliphatic substituted ethylenic copolymers upon substrate surfaces, and more specifically to a method for pre-conditioning the substrate surface for acceptance of a coating of castable high molecular weight amorphous fluorinated polymer layers, specifically a fluoropolymer having a structural formula with the repeating unit:

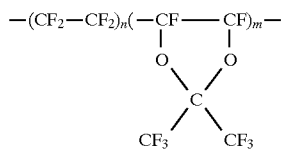

wherein "m" and "n" represent integers providing a molecular weight of between about 230,000 and 500,000, with the relative values of "m" and "n" providing a copolymer with a glass transition temperature ranging from between about 160° C. and 240° C.

In the past, certain fluoropolymers of relatively lower molecular weight and consisting essentially of tetrafluoroethylene have been utilized in a wide variety of applications. Specifically, these polymers have been available in solid or powder form, for use in preparing molded and/or extruded articles as well as films and coatings. For example, the polymer has also been available in aqueous dispersion form for the preparation of non-stick coatings as well as in certain other applications requiring surfaces with low friction. Because of its relatively low coefficient of friction, the material has further been utilized as a finish for multi-filament filaments and/or fibers. One of the most common applications of tetrafluoroethylene polymers has been in the formation of finishes and/or films for cookware to provide non-stick surfaces for food preparation.

Recently, a variety of fluoropolymers, specifically a fluoropolymer having a structural formula with the repeating unit:

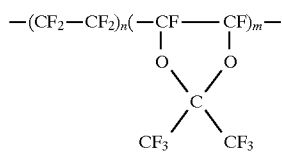

wherein "m" and "n" represent integers providing a molecular weight of between about 230,000 and 500,000, with the relative values of "m" and "n" providing a copolymer with a glass transition temperature ranging from between about 160° C. and 240° C., a commercial form of which is identified by the code name "Teflon AF Amorphous Fluoropolymer", this material being available commercially from E. I. DuPont de Nemours Co., Inc. of Wilmington, Del. This fluoropolymer has somewhat different physical, electrical, and chemical properties from conventional tetrafluoroethylene polymers, and is suitable for use as a (dispersion, solvent, liquid, or whatever forms are available). In liquid dispersion form, the material has been found adapted to produce castable coatings. Additionally, the material can be hot-pressed into sheets to form useful objects. Because of the unusual physical properties of this high molecular weight amorphous fluoropolymer material, adhesion of the castable materials has presented problems in finding techniques for application primarily because of the unavailability of suitable techniques for achieving adhesion to substrate surfaces. One particularly valuable property of the material is its dielectric constant, with the material having been found to possess the lowest dielectric constant of plastics, particularly at gigahertz frequencies.

In accordance with the present invention, however, a method has been developed which provides a means for laying down a castable film of amorphous fluoropolymer consisting essentially of evaporatively depositing an initial or primer layer of this high molecular weight fluoropolymer (ethylenic-cyclo oxyaliphatic substituted ethylenic) and thereafter applying one or more relatively thick layers of this same material onto the primer layer. In this fashion, the second application is undertaken with the polymer in liquid solution and/or dispersion form, and it is in this form that the castable film develops good adhesion to the surface upon which it is deposited. Also, in this form, the unusual electrical properties are preserved, specifically the low dielectric constant at gigahertz frequencies.

Specifically, and in accordance with the present invention, an initial or primary layer of high molecular weight fluoropolymer of ethylenic-cyclo oxyaliphatic substituted ethylenic is applied to the substrate upon which the castable coating is to be formed. The initial or primer film is applied to the surface of the substrate by vacuum deposition techniques, with such techniques having been found to provide films with good adhesive as well as cohesive properties. Once the primer film has been evaporatively deposited onto the surface of the substrate, a coating of the castable film of high molecular weight amorphous fluorinated copolymer consisting of the same fluoropolymer is applied or otherwise cast thereover. Application techniques for the liquid forms include brushing, spraying, dipping and spinning. Following the casting operation and evaporation of the solvent, the coating formed by the residue possesses the unusual physical and electrical properties of the high molecular weight amorphous fluoropolymer material, and in addition may be deposited as a relatively thick layer onto the surface of the substrate. These coatings, which may be cured with only room temperature or low heat requirements, may have thicknesses ranging up to and over 0.25 millimeters. It has also been found that the coatings, when cast into thin-film form, are substantially pinhole-free, and will achieve this property without requiring sintering.

The castable fluoropolymer (ethylenic-cyclo oxyaliphatic substituted ethylenic) material utilized in accordance with the present invention is available in particulate or granular form. As indicated hereinabove, the molecular weight of the polymer ranges from between about 230,000 and 500,000, and as such, possesses a property of forming stable solutions which can be used to form desirable coatings. For example, the material possesses solubility of up to between about 3% and 5% in certain liquid fluorocarbons, with certain forms of the high molecular weight amorphous material possessing a solubility limit of up to about 12% in such solvents. The technique of the present invention widens the scope of use of the material, since it renders it possible to form relatively thick coatings of this material with the desirable adhesive and cohesive properties. In solution form, the material can be loaded with finely powdered silica, with such materials drying so as to form filled coatings.

Therefore, it is a primary object of the present invention to provide an improved process for the preparation of castable coatings of amorphous fluoropolymers consisting essentially of high molecular weight fluorinated (ethylenic-cyclo oxyaliphatic substituted ethylenic) copolymer and wherein the coatings may be prepared in part by dipping, spinning, brushing, spraying or other application techniques.

It is a further object of the present invention to provide an improved method for the preparation of relatively thick coatings of amorphous fluoropolymers consisting essentially of fluorinated (ethylenic-cyclo oxyaliphatic substituted ethylenic) copolymer, and wherein the initial or primer film is formed upon the substrate by evaporative deposition techniques.

It is yet a further object of the present invention to provide an improved amorphous fluoropolymer coating which is relatively thick in cross-section, and which is repairable in the event of damage to certain portions of the surface thereof.

Other and further objects of the present invention will become apparent to those skilled in the art upon a study of the following specification, appended claims, and accompanying drawing.

IN THE DRAWING

FIG. 1 is a flowchart illustrating a typical procedure involved in practicing the present invention.

DESCRIPTION OF THE PREFERRED EMBODIMENT

In order to best explain the various aspects of the present invention, the following specific examples are given.

EXAMPLE I

A substrate of aluminum metal measuring 3"×2"×1/16" was placed within a vacuum chamber along with a boat containing a charge of 8 grams of solid amorphous fluoropolymer having a structural formula with the repeating unit:

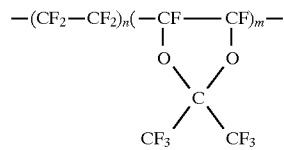

wherein "m" and "n" represent integers providing a molecular weight of between about 230,000 and 500,000, with the relative values of "m" and "n" providing a copolymer with a glass transition temperature ranging from between about 160° C. and 240° C. The chamber was evacuated to $10^{-5}$ TORR and the boat heated to a temperature sufficiently high to commence evaporative deposition, with the contents of the boat being disposed in appropriate line-of-sight disposition with respect to the substrate being coated. After a period of 5 minutes, the boat was permitted to cool and the evacuated chamber permitted to return to atmosphere. In order to accomplish the evaporative deposition operation, the source was warmed up slowly for a period of about 8 minutes prior to deposition. The 5-minute interval indicated is the time utilized for the deposition operation only, with a deposit rate of approximately 11 Å per second being achieved.

The substrate received a coating of approximately 3,325 Å, which was found to be highly receptive to a second applied coating of the same high molecular weight fluoropolymer of ethylenic-cyclo oxyaliphatic substituted ethylenic in dissolved solids form.

More particularly, amorphous fluoropolymer (ethylenic-cyclo oxyaliphatic substituted ethylenic) solids dissolved in a liquid fluorocarbon mixture were applied, by eye-dropper brush application, upon the surface of the previously deposited film. The coating was permitted to air-dry and the resultant composite coating was both coherent and adherent to the aluminum metal surface, and was found to have a uniform adherent and coherent structure with a thickness of approximately 2–5 mils.

The samples prepared on the aluminum substrate have been tested through temperature cycles extending between –65° C. to 250° C. for a total of ten cycles, with a 4-minute ramp-up and ramp-down time. No loss of adhesion was experienced, nor was any change in optical properties observed.

EXAMPLE II

The process of Example I was repeated with a substrate of aluminum foil (2.5 mils thick) with comparable results.

EXAMPLE III

A substrate of stainless steel metal measuring 3"×2"×1/16" was placed within a vacuum chamber along with a boat containing a charge of 8 grams of amorphous fluoropolymer of ethylenic-cyclo oxyaliphatic substituted ethylenic solids as used in Example I. The chamber was evacuated to $10^{-5}$ TORR and the source heated as in Example I, with the contents of the boat being disposed in appropriate sight disposition with respect to the substrate being coated. After a deposition period of 5 minutes, the boat was permitted to cool and the evacuated chamber permitted to return to atmosphere.

The substrate received a coating having a thickness of approximately 3,000 Å, which was found to be highly receptive to a second applied coating of the same fluoropolymer of ethylenic-cyclo oxyaliphatic substituted ethylenic in dissolved solids form. The vacuum system is, of course, opened in order to permit application of the liquid coating to the primed substrate.

More particularly, amorphous fluoropolymer of ethylenic-cyclo oxyaliphatic substituted ethylenic solids dissolved in a liquid fluorocarbon mixture were placed, by liquid application, upon the surface of the previously deposited film. The coating was permitted to air-dry and the resultant composite coating was both coherent and adherent to the stainless steel metal surface,, and was found to have a thickness of approximately 5 mils.

EXAMPLE IV

A substrate of polyimide film having a 2,000 Å film of aluminum applied thereon was utilized as a substrate. The aluminum metal is coated pursuant to the process parameters set forth in Example I with reasonable results. In this particular arrangement, however, multiple pass coatings for the liquid formulations should provide benefits for reducing stresses in the finished product.

GENERAL COMMENTARY

Fluoropolymers as utilized in Example I are commercially available. These materials are available from E. I. DuPont de Nemours Co. of Wilmington, Del. under the code name "Teflon AF Amorphous Fluoropolymer 2400" and "A-1600". The fluorocarbon solvent in which the fluorinated (ethylenic-cyclo oxyaliphatic substituted ethylenic) copolymer dissolves is also commercially available, and is available from Minnesota Mining and Manufacturing Co., of St. Paul, Minn. under the code name "FC-75". This fluorocarbon is in liquid form at normal atmospheric conditions, and is believed to comprise essentially a perfluorocarbon.

As has been indicated above, the liquid solutions containing the amorphous fluorinated (ethylenic-cyclo oxyaliphatic substituted ethylenic) copolymer in accordance with the present invention may be loaded with powdered silica or other filler. Specifically, it has been found that, when loaded with powdered silica, specifically up to about 50% by weight of powdered silica based upon amorphous fluorinated (ethylenic-cyclo oxyaliphatic substituted ethylenic) copolymer solids, a film is formed having high resistance to decomposure upon exposure to atmospheres containing quantities of atomic oxygen.

The fluoropolymer material utilized in connection with the present invention is fluorinated (ethylenic-cyclo oxyaliphatic substituted ethylenic) copolymer. The repeating unit, which may be defined as a dioxole monomer includes a five member ring structure including oxygen, carbon and fluorine. This dioxole monomer and tetrafluoroethylene are copolymerized into the amorphous copolymer structure having the repeating unit:

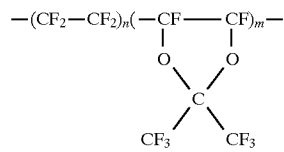

wherein "m" and "n" represent integers providing a molecular weight of between about 230,000 and 500,000, with the relative values of "m" and "n" providing a copolymer with a glass transition temperature ranging from between about 160° C. and 240° C. The relative values of "m" and "n" in the polymer chain determine the glass transition temperature of the material. As the ratio of "m/n" increases, the glass transition temperature also increases.

The flowchart of FIG. 1 is provided in order to assist those skilled in the art in their comprehension of the remaining features of this disclosure, it being noted that the specific operations described in the flowchart are given by way of example only.

For most purposes, a minimum thickness of evaporated primer has been found to be about 1500 Å, with this thickness being utilized to achieve good bonding with the substrate and the liquid/amorphous fluorinated (ethylenic-cyclo oxyaliphatic substituted ethylenic) copolymer solid mixtures.

In certain applications, it has been found helpful to heat the substrate prior to deposition. Standard bell-jar glow discharge pre-treatment may be utilized if desired, to provide improved adhesion results.

It will be appreciated that those individuals skilled in the art may depart from the specific details contained in examples given herein without departing from the spirit and scope of the present invention.

I claim:

1. The method of preparing an adherent and coherent castable amorphous fluorinated copolymer coating upon the surface of a substrate, the coating consisting essentially of high molecular weight fluoropolymers of ethylenic-cyclo oxyaliphatic substituted ethylenic copolymer, and including the steps of:

(a) depositing an adherent initial film of a fluoropolymer having a thickness between about 1,500 Å and 50,000 Å to the surface of said substrate by vacuum deposition, said initial fluoropolymer coating being selected from the group consisting of fluorinated ethylenic-cyclo oxyaliphatic substituted ethylenic copolymers and having the structural repeating unit:

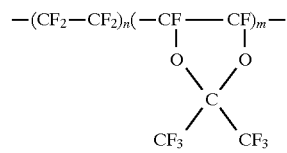

wherein "m" and "n" represent integers providing a molecular weight of between about 230,000 and 500,000, with the values of "m" and "n" providing a copolymer with a glass transition temperature ranging from between about 160° C. and 240° C.; and (b) thereafter applying a second coating as a coverlay upon said initial film, said second coating consisting essentially of an amorphous fluorinated ethylenic-cyclo oxyaliphatic substituted ethylenic copolymer and having the structural repeating unit:

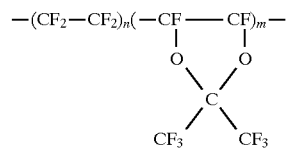

wherein "m" and "n" represent integers providing a molecular weight of between about 230,000 and 500,000, with the values of "m" and "n" providing a copolymer with a glass transition temperature ranging from between about 160° C. and 240° C., the second coating being applied to said initial film layer in castable liquid state, and with the composite film having a thickness greater than about 2 mils.

2. The method as defined in claim 1 wherein the evaporative deposition is undertaken at a pressure of approximately $10^{-5}$ TORR.

3. The method of preparing an adherent and coherent castable amorphous fluorinated ethylenic-cyclo oxyaliphatic substituted ethylenic copolymer coating upon the surface of a substrate and including the steps of:

(a) depositing an adherent initial film of a fluorinated ethylenic-cyclo oxyaliphatic substituted ethylenic copolymer having a thickness between about 1,500 Å and 10,000 Å to the surface of said substrate by vacuum deposition, said initial fluorinated ethylenic-cyclo oxyaliphatic substituted ethylenic copolymer coating being a fluoropolymer having the structural repeating unit:

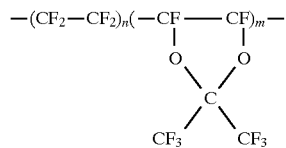

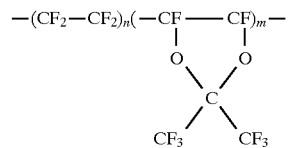

wherein "m" and "n" represent integers providing a molecular weight of between about 230,000 and 500,000, with the values of "m" and "n" providing a copolymer with a glass transition temperature ranging from between about 160° C. and 240° C.;

(b) thereafter depositing a second adherent film of a fluorinated ethylenic-cyclo oxyaliphatic substituted ethylenic copolymer having a thickness of between about 2,000 Å to 10,000 Å to the surface of said adherent initial film, said second coating also being selected from the group consisting of fluorinated ethylenic-cyclo oxyaliphatic substituted ethylenic copolymers with a structural formula having the repeating unit:

wherein "m" and "n" represent integers providing a molecular weight of between about 230,000 and 500,000, with the values of "m" and "n" providing a copolymer with a glass transition temperature ranging from between about 160° C. and 240° C.; and (c) thereafter applying a coverlay coating upon the surface of said second deposited film, said coverlay coating consisting essentially of the same amorphous fluorinated ethylenic-cyclo oxyaliphatic substituted ethylenic copolymer and being applied to the surface of said second deposited film in castable liquid state, and with the composite film having a thickness greater than about 2 mils.

* * * * *